(12) United States Patent
Thean et al.

(10) Patent No.: US 7,781,839 B2
(45) Date of Patent: Aug. 24, 2010

(54) STRUCTURE AND METHOD FOR STRAINED TRANSISTOR DIRECTLY ON INSULATOR

(75) Inventors: Voon-Yew Thean, Austin, TX (US); Bich-Yen Nguyen, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 90 days.

(21) Appl. No.: 11/694,273

(22) Filed: Mar. 30, 2007

(65) Prior Publication Data
US 2008/0237635 A1 Oct. 2, 2008

(51) Int. Cl.
*H01L 27/092* (2006.01)
(52) U.S. Cl. .................. 257/350; 257/69; 257/618; 257/E27.062
(58) Field of Classification Search .............. 257/69, 257/350, 618, E27.062
See application file for complete search history.

(56) References Cited

U.S. PATENT DOCUMENTS

| 7,034,362 B2 * | 4/2006 | Rim ..................... 257/351 |
| 7,410,859 B1 * | 8/2008 | Peidous et al. ............. 438/231 |
| 2004/0126998 A1 | 7/2004 | Fendel et al. |
| 2005/0082531 A1 * | 4/2005 | Rim ..................... 257/72 |
| 2005/0093076 A1 | 5/2005 | Steegen et al. |
| 2005/0112817 A1 | 5/2005 | Cheng et al. |

* cited by examiner

*Primary Examiner*—Victor A Mandala
(74) *Attorney, Agent, or Firm*—Kim-Marie Vo

(57) ABSTRACT

A semiconductor device (10) comprising a substrate (12) and an oxide layer (14) formed over the substrate is provided. The semiconductor device further includes a first semiconductor layer (16) having a first lattice constant formed directly over the oxide layer. The semiconductor device further includes a second semiconductor layer (26) having a second lattice constant formed directly over the first semiconductor layer, wherein the second lattice constant is different from the first lattice constant.

12 Claims, 6 Drawing Sheets

STRUCTURE AND METHOD FOR STRAINED TRANSISTOR DIRECTLY ON INSULATOR

BACKGROUND

1. Field

This disclosure relates generally to semiconductor device structures, and more specifically, to a structure and method for strained transistor directly on insulator.

2. Related Art

With known very short channel transistor device structures, saturation current (Idsat) enhancement due to low-field mobility improvement is dramatically reduced due to velocity saturation. In addition, the use of relaxed silicon carbon (SiC) degrades mobility due to the presence of carbon (C).

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A structure and method for strained transistor directly on insulator according to one embodiment of the present disclosure includes a transistor structure comprising a thin strained SiC directly on a strained silicon-on-insulator (SSOI) substrate. The thin strained SiC includes between 0.1-3.0 percent carbon (0.1-3.0% C) to achieve the device structure. In one embodiment, the device structure utilizes strained Si (s-Si) to strain SiC to achieve high saturation velocity while minimizing mobility degradation due to carbon incorporation. The method of making the device structure includes deposition of a thin SiC layer directly onto strained Si of an SSOI substrate with a thick patterned oxide. In one embodiment, the SiC is deposited using a blanket deposition, wherein undesired SiC is subsequently removed, for example, via suitable etching of the same. In another embodiment, the SiC is selectively deposited.

The strained transistor directly-on-insulator embodiments of the present disclosure advantageously make use of the biaxial strain from an SSOI wafer to strain a thin SiC channel layer. In general, an SiC layer by itself has an intrinsically higher electron saturation velocity (vsat) but lower mobility. However, with the use of strain, the electron mobility in the SiC channel layer can be advantageously improved. In addition, with higher vsat and mobility, more Idsat enhancement can advantageously be obtained.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
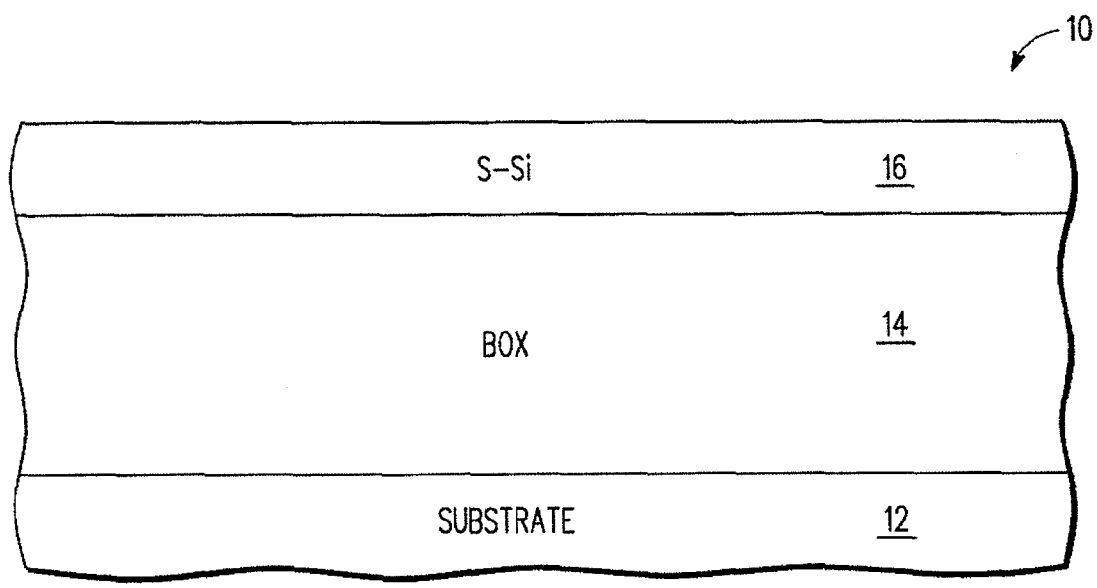
FIGS. 1-7 are cross-sectional views of a portion of a semiconductor structure at various stages of a method for making the same, according to one embodiment of the present disclosure.

FIGS. 1-7 are cross-sectional views of a portion of a semiconductor structure 10 at various stages of a method for making the same, according to one embodiment of the present disclosure. Referring now to FIG. 1, the method of forming semiconductor structure 10 begins with providing an un-patterned strained semiconductor wafer, the strained semiconductor wafer including a substrate 12, an insulator layer 14 and a strained semiconductor layer 16 overlying the insulator layer. In one embodiment, the strained semiconductor wafer comprises an un-patterned strained-silicon on insulator (SSOI) wafer. The BOX layer 14 comprises a buried oxide (BOX) layer having a thickness on the order of approximately 200-2000 Angstroms. The strained semiconductor layer 16 comprises a strained silicon (s-Si) layer having a thickness on the order of approximately 200-500 Angstroms.

Figure 2:
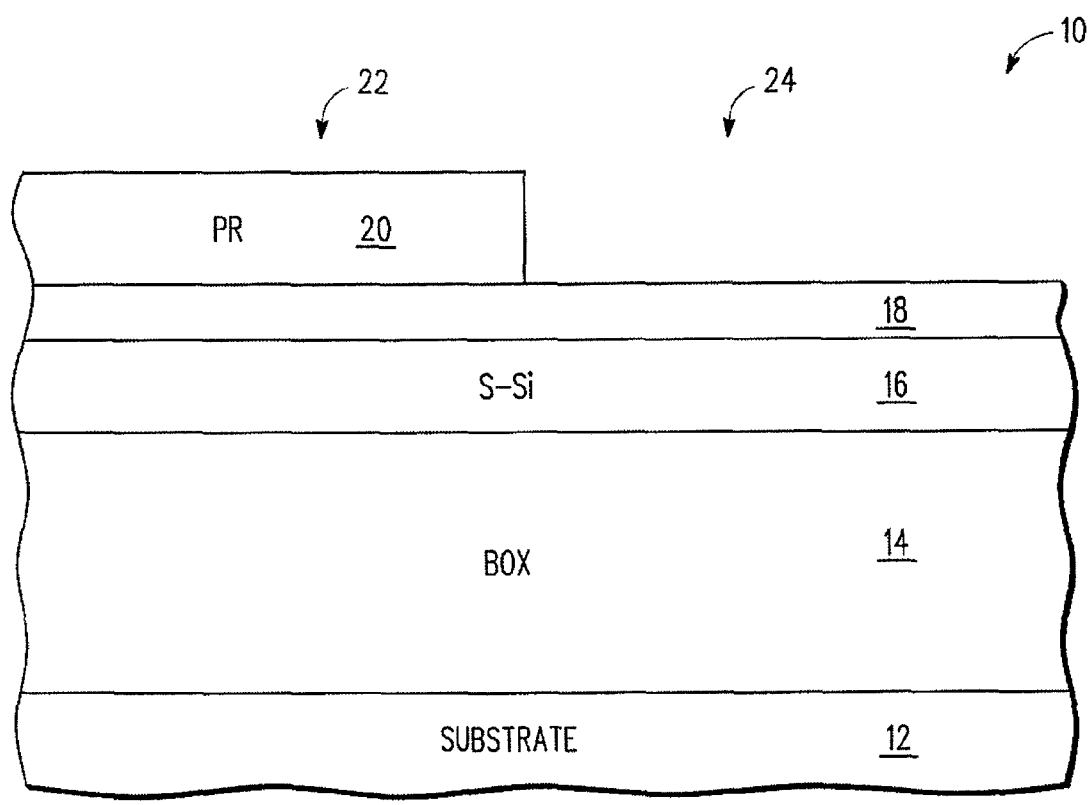

Turning now to FIG. 2, the method includes depositing a protective masking layer 18 over the strained semiconductor layer 16. The masking layer 18 comprises, for example, an oxide layer have a thickness on the order of approximately 50-500 Angstroms. The relative thickness of the masking layer 18 is selected according to the requirements of a given strained transistor directly on insulator application. In particular, masking layer 18 provides protection to the underlying strained semiconductor layer 16 during subsequent process steps, as discussed herein.

A patterned photoresist 20 is formed over the masking layer 18, using any suitable photolithography techniques and photoresist(s). In one embodiment, the patterned photoresist 20 is formed in a PMOS device region, generally indicated by reference numeral 22. The photoresist is removed from an NMOS device region, generally indicated by reference numeral 24. Subsequent to formation of the patterned photoresist 20, the masking layer 18 is etched, using a suitable etch, to remove the masking layer from the NMOS device region 24. The patterned photoresist 20 is then removed from the device structure 10.

Figure 3:
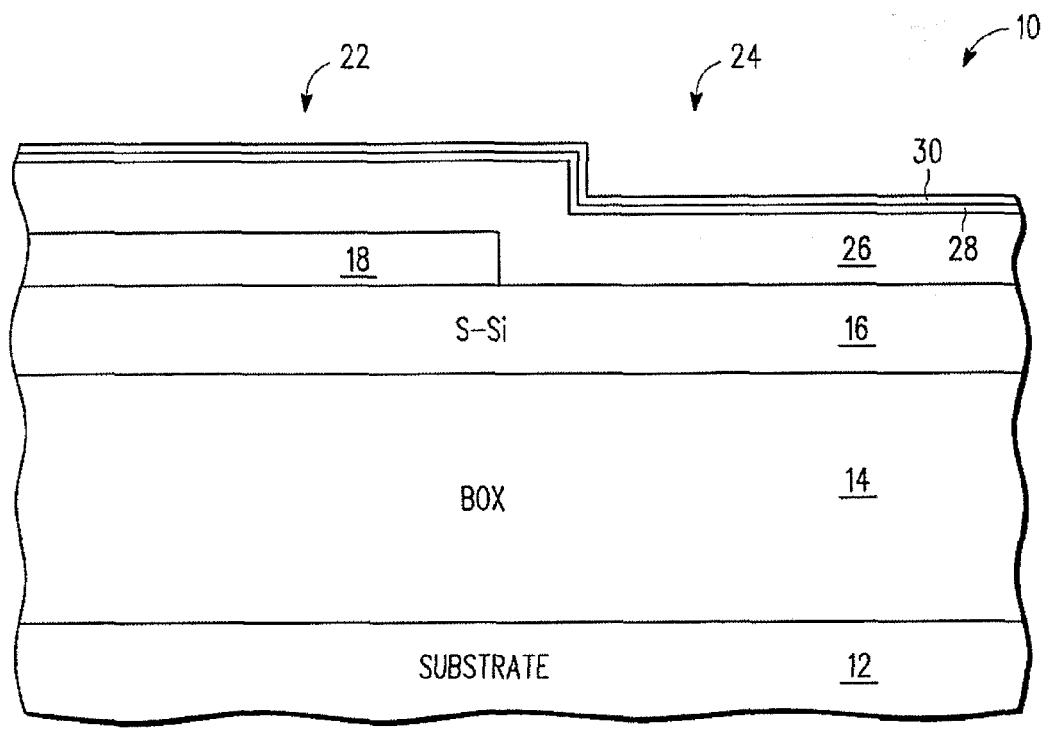

Referring now to FIG. 3, according to one embodiment, a second strained semiconductor layer 26 is formed over the remaining portion of the masking layer 18 in the PMOS device region 22 and over the exposed portion of the first strained semiconductor layer 16 in the NMOS device region 24. The second strained semiconductor layer 26 is characterized by an intrinsic strain. In one embodiment, the second strained semiconductor layer 26 comprises a blanket deposited silicon carbon (SiC) layer having a thickness on the order of 100-150 Angstroms. Blanket deposition of the SiC layer can include use of silane ($SiH_4$) and methane ($CH_3$).

In connection with a blanket deposited strained semiconductor layer 26, the portion of layer 26 formed over the remaining portion of the masking layer 18 in the PMOS device region 22 is polycrystalline, whereas, the portion of layer 26 formed over the strained semiconductor layer 16 in the NMOS device region 24 is single crystal or crystalline. In addition, the strained semiconductor layer 16 comprises a template strain layer configured for amplifying the intrinsic strain of the second strained semiconductor layer 26. A thin semiconductor cap layer 28 is formed over the second strained semiconductor layer 26, followed by the formation of a thin dielectric 30. The thin semiconductor cap layer can include a strained or non-strained layer and preserves the underlying interface for a subsequent high quality gate oxide formation. The thin dielectric protects the thin semiconductor cap layer surface during subsequent patterning steps. In one embodiment, the thin semiconductor cap layer 28 comprises a silicon cap layer and the thin dielectric 30 comprises a thin oxide. In addition, the first strained semiconductor layer 16 can include a first lattice constant formed directly over the insulator layer 14 and the second strained semiconductor layer 16 can include a second lattice constant formed directly over the first semiconductor layer, wherein the second lattice constant is different from the first lattice constant.

Figure 4:
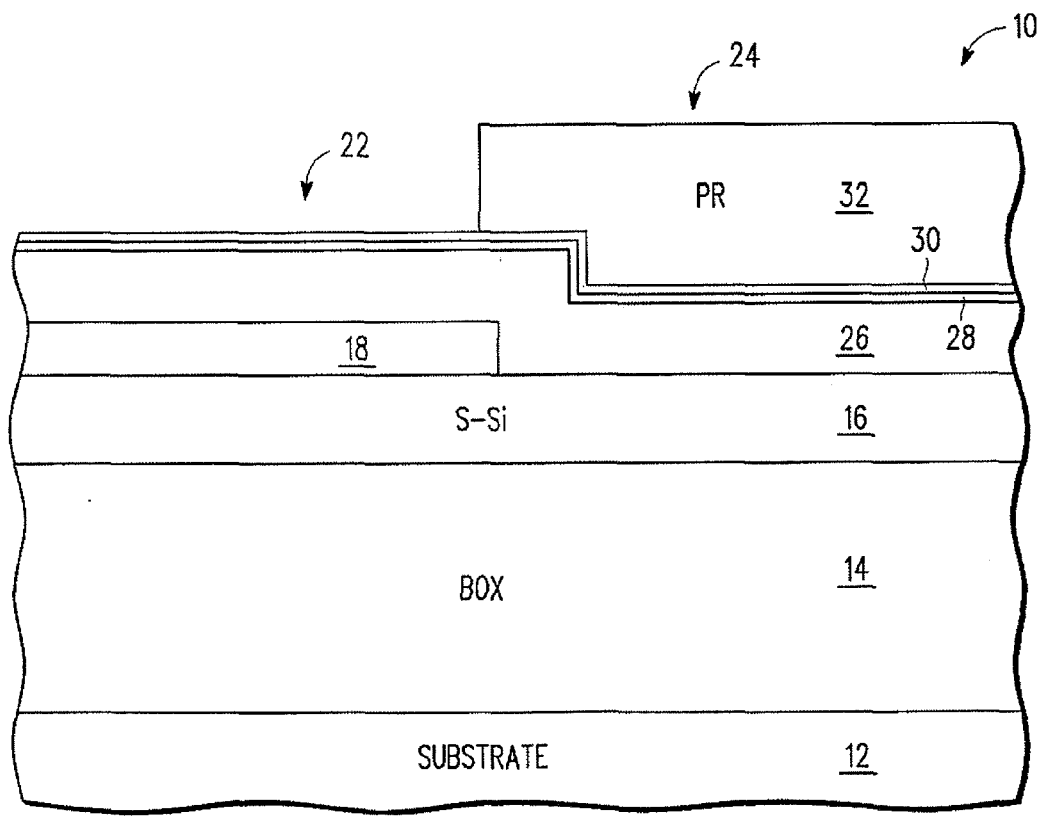

Following formation of the second strained semiconductor layer 26, the semiconductor cap layer 28, and the thin dielectric 30, the method includes forming a patterned photoresist 32 overlying the NMOS device region 24, as illustrated in FIG. 4. The patterned photoresist 32 also extends into the PMOS device region 22 a slight amount, having a portion thereof overlying masking layer 18 as shown in FIG. 4. Patterned photoresist 32 is formed using any suitable photolithography techniques and photoresist(s). In addition, patterned photoresist 32 provides an appropriate protection of the layers in the NMOS device region 24 during a subsequent processing of the layers in the PMOS device region 22, further as discussed herein.

Figure 5:
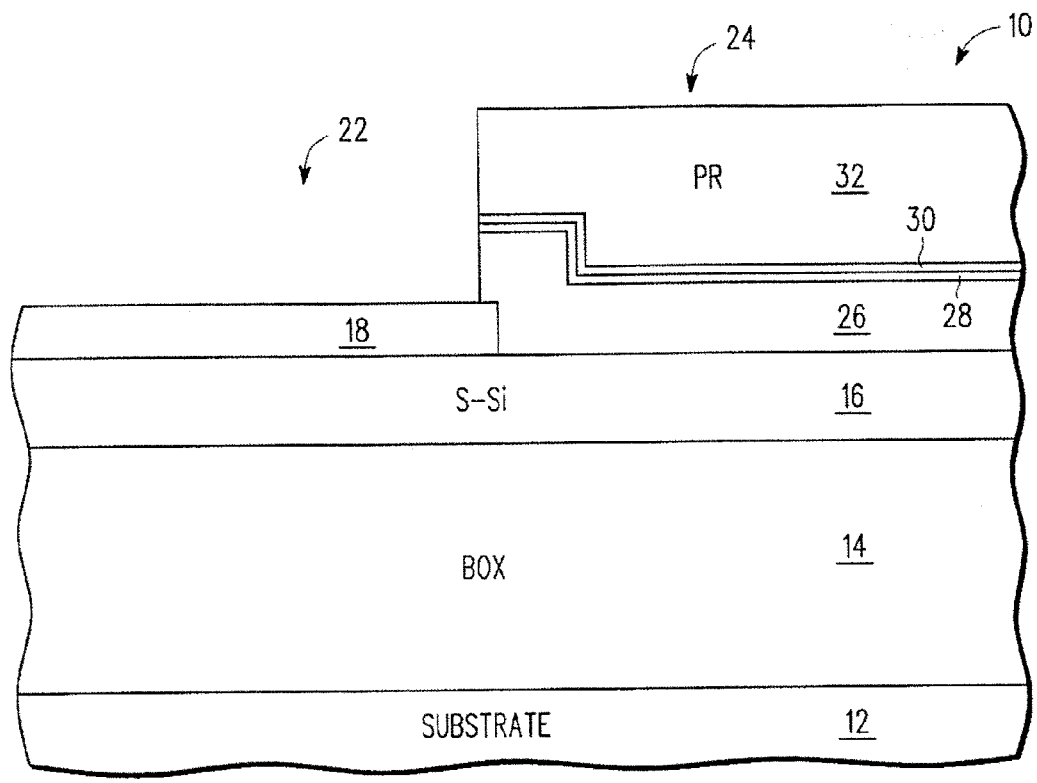

Referring now to FIG. 5, a portion of the second strained semiconductor layer 26, the semiconductor cap layer 28, and the thin dielectric 30 in the PMOS device region 22 (exposed by the absence of patterned photoresist 32) are removed. The removal of the corresponding layers thus exposes the masking layer 18 in the PMOS device region 22. However, a small portion of masking layer 18 remains covered due to the slight overlap of the masking layer 18 by the patterned photoresist 32. Removal of the corresponding portions of the second strained semiconductor layer 26, the semiconductor cap layer 28, and the thin dielectric 30 in the PMOS device region 22 is performed using any suitable etch and/or etching technique(s). The patterned photoresist 32 is then removed from the device structure 10, using any suitable technique(s).

Figure 6:
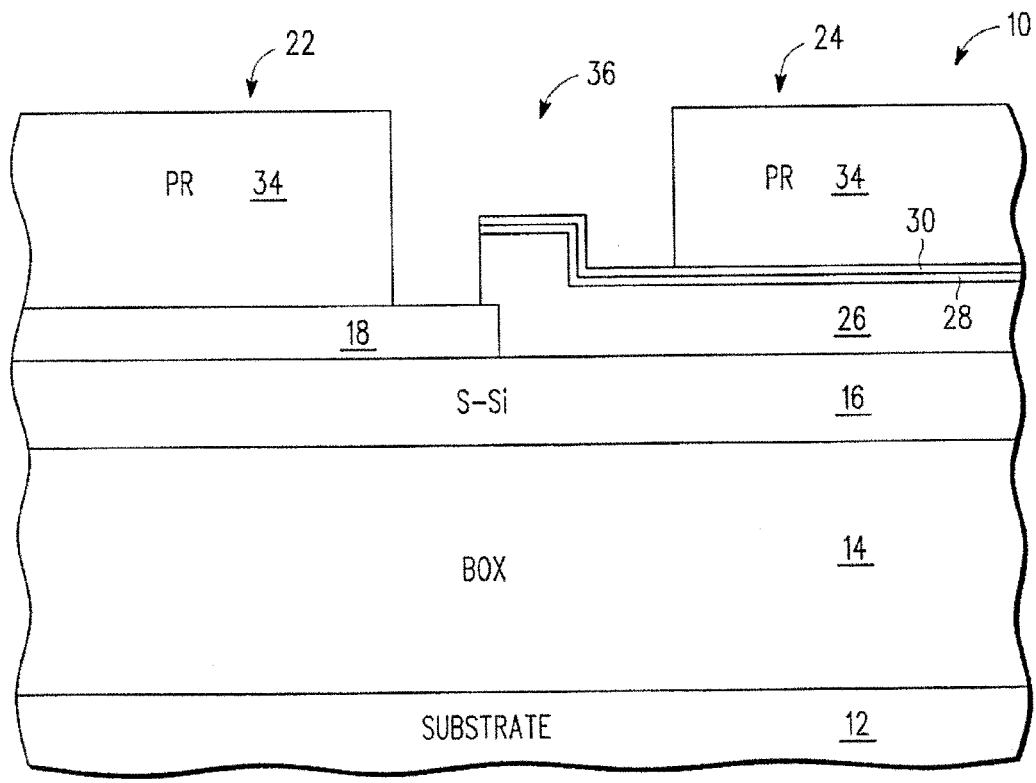
Figure 7:
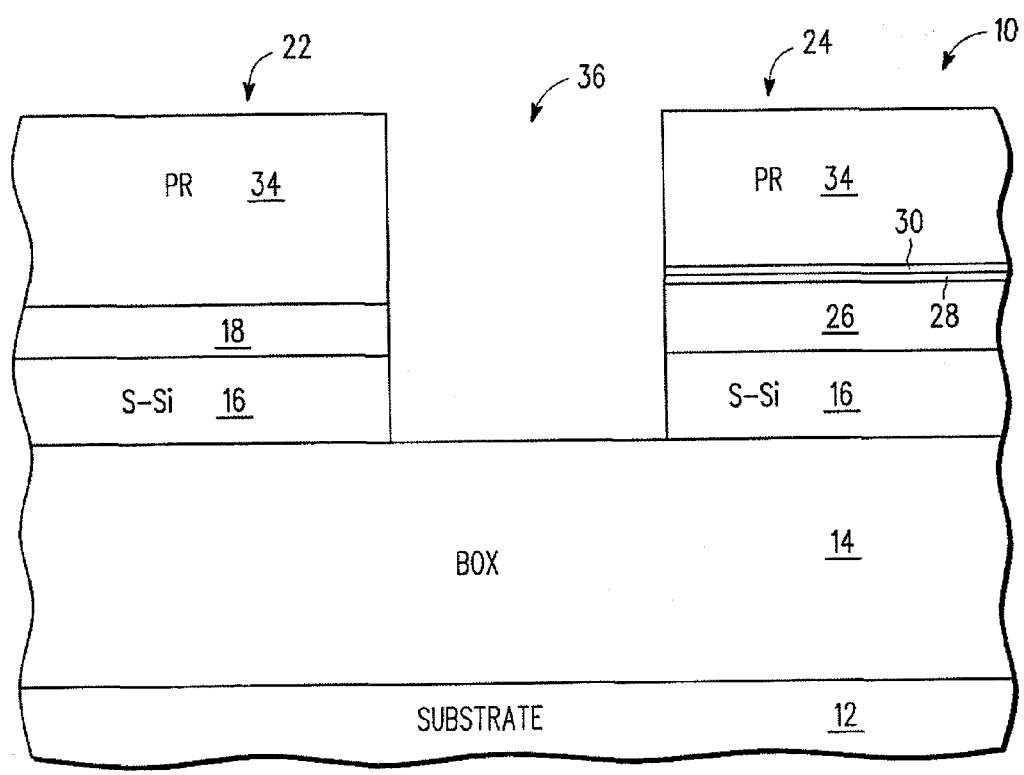

Turning now to FIG. 6, a patterned photoresist 34 is formed overlying portions of both the PMOS device region 22 and the NMOS device region 24. Patterned photoresist 34 includes an opening 36, wherein the opening is provided in preparation for isolation formation. An appropriate etch is then carried out to remove portions of the various layers that are exposed by opening 36, wherein the etch removes the corresponding layer material down to the insulator layer 14, as illustrated in FIG. 7. Subsequently, the patterned photoresist 34 is removed from the device structure 10, using any suitable technique(s).

As a result of etching the layer through opening 36, the PMOS device region 22 and NMOS device region 24 are effectively isolated from one another. Masking layer 18 and dielectric cap layer 30 are then selectively removed in the respective PMOS and NMOS device regions 22 and 24. The resulting exposed semiconductor surfaces in both the PMOS device region 22 and the NMOS device region 24 are then ready for subsequent transistor device processing.

In one example embodiment, the first strained semiconductor layer comprises a SSOI silicon layer having a thickness on the order of 367 Angstroms with a stress on the order of one Giga Pascals (1 GPa). The second strained semiconductor layer comprises a silicon carbon (Si:C(1% C)) layer having a thickness on the order of 117 Angstroms with a stress on the order of one and seven tenths Giga Pascals (1.7 GPa). The increase in film stress of the Si:C on SSOI for such an example embodiment is on the order of seventy percent (70%). As a result, a desired strained channel is advantageously formed comprising SiC on SSOI for use in high-performance and low-power semiconductor device applications. The resultant strained channel is more stable and less defective that previously achievable.

Figure 8:
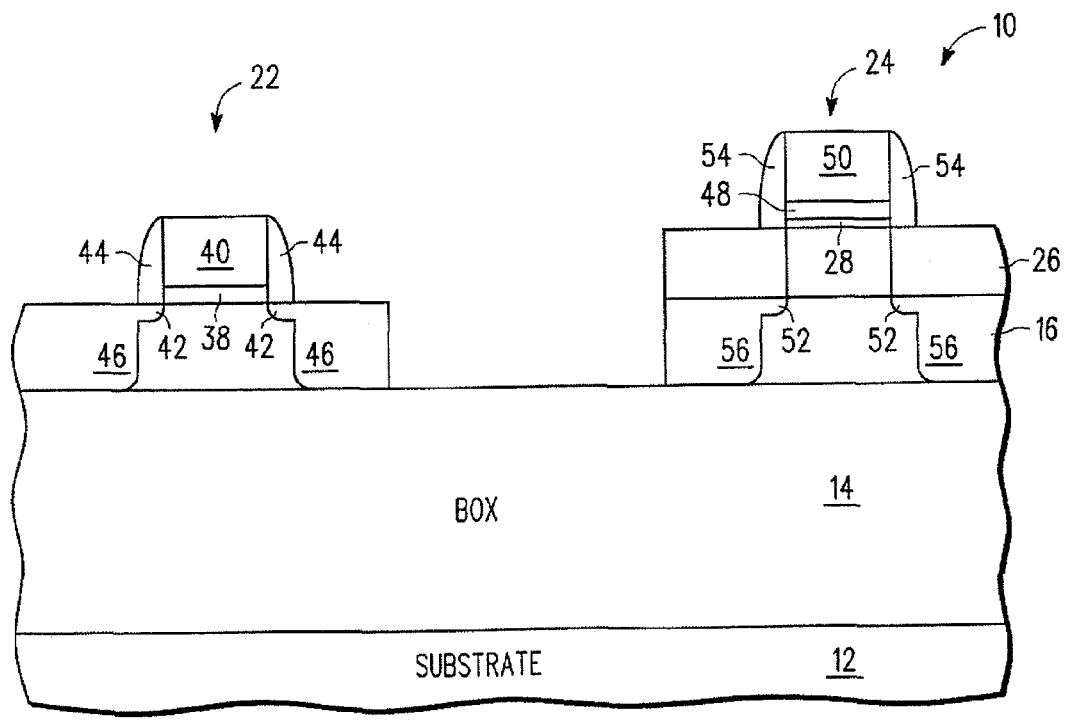
FIG. 8 is a cross-sectional view of a portion of a semiconductor structure including a strained transistor on strained layer directly on insulator formed by the methods according to the embodiments of the present disclosure.

FIG. 8 is a cross-sectional view of a portion of a semiconductor structure including a strained transistor on strained layer directly on insulator formed by the methods according to the embodiments of the present disclosure. In particular, the method includes forming semiconductor or transistor devices in the PMOS device region 22 and the NMOS device region 24 using any suitable semiconductor processing techniques. A semiconductor device formed in the PMOS device region 22 makes use of the strained semiconductor layer 16 as the channel layer. A semiconductor device formed in the NMOS device region 22 makes use of the second strained semiconductor layer 26 (as the channel layer) and the strained semiconductor layer 16. According to the embodiments of the present disclosure, the second strained semiconductor layer possesses an amplified intrinsic strain, wherein the intrinsic strain of the second strained semiconductor layer has been amplified by the strain of the first strained semiconductor layer (or template strain layer) 16.

In an alternate embodiment, the stack of 26 (SiC) and 16 (SSi) may also be useful for concurrently weakening PMOS and enhancing NMOS performance for an SRAM application. In certain circuit applications, where PMOS performance may be weakened relative to NMOS performance, the deposited SiC layer can be left (i.e., remain) over the PMOS region to lower it's channel low-field mobility. An example application of such a circuit would be a six-transistor SRAM bitcell with PMOS load transistors. Other circuit applications may also be useful.

The transistor device formed in the PMOS device region 22 includes, for example, a gate dielectric 38, gate electrode 40, source/drain extension regions 42, sidewall spacers 44, and deep source/drain regions 46. Similarly, the transistor device formed in the NMOS device region 24 includes, for example, a gate dielectric 48, gate electrode 50, source/drain extension regions 52, sidewall spacers 54, and deep source/drain regions 56. Transistors in PMOS and NMOS device regions 22 and 24, respectively, can comprise any suitable semiconductor devices according to the requirements of a given semiconductor device application. In addition, the device structure 10 may also include additional suitable isolation regions (not shown), for example, between the device in PMOS region 22, the device in NMOS region 24, and possibly other devices (not shown).

Figure 9:
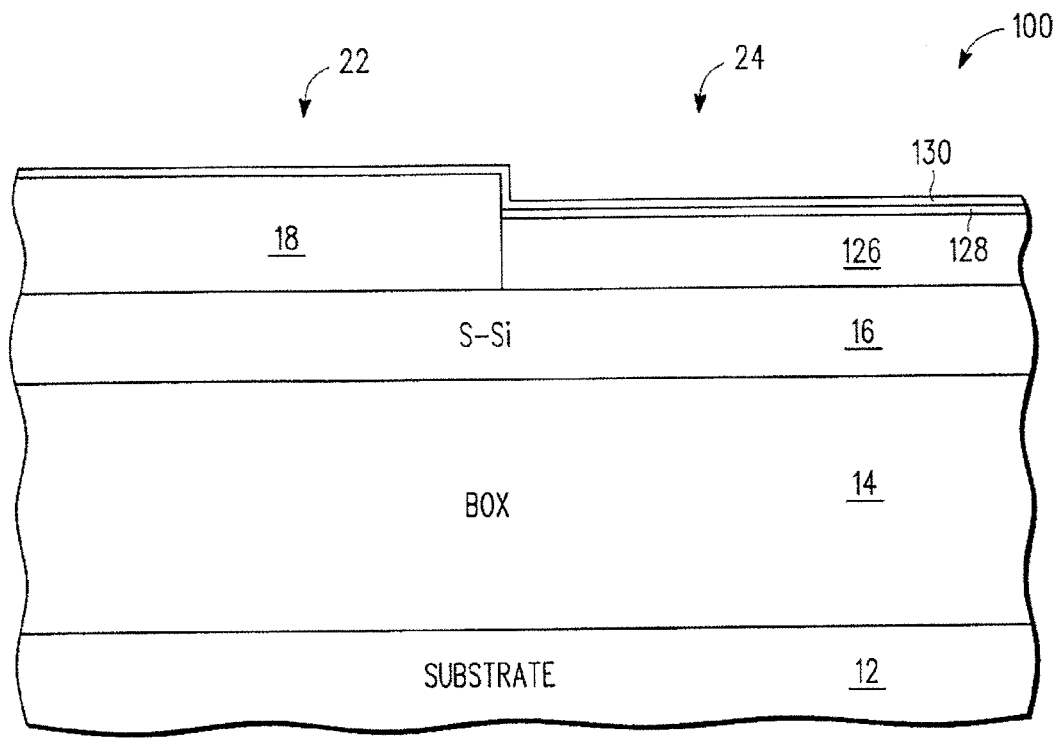
FIGS. 9-11 are cross-sectional views of a portion of a semiconductor structure at various stages of a method for making the same, according to another embodiment of the present disclosure.
Figure 10:
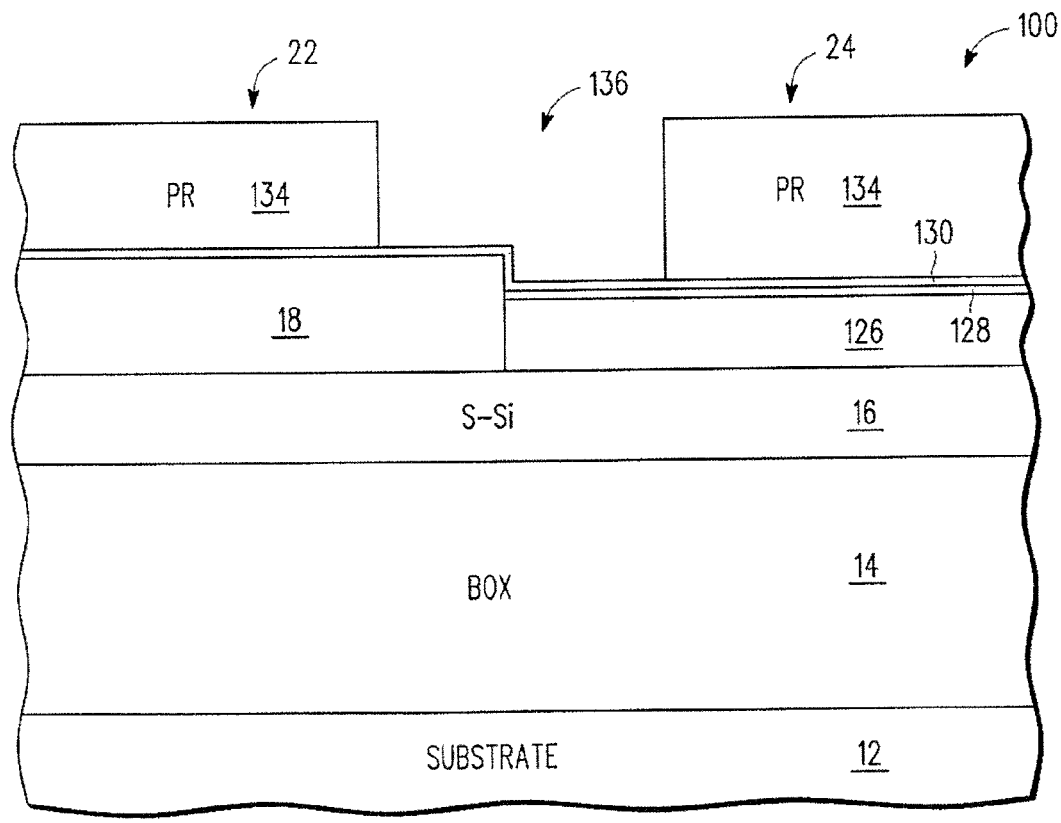
Figure 11:
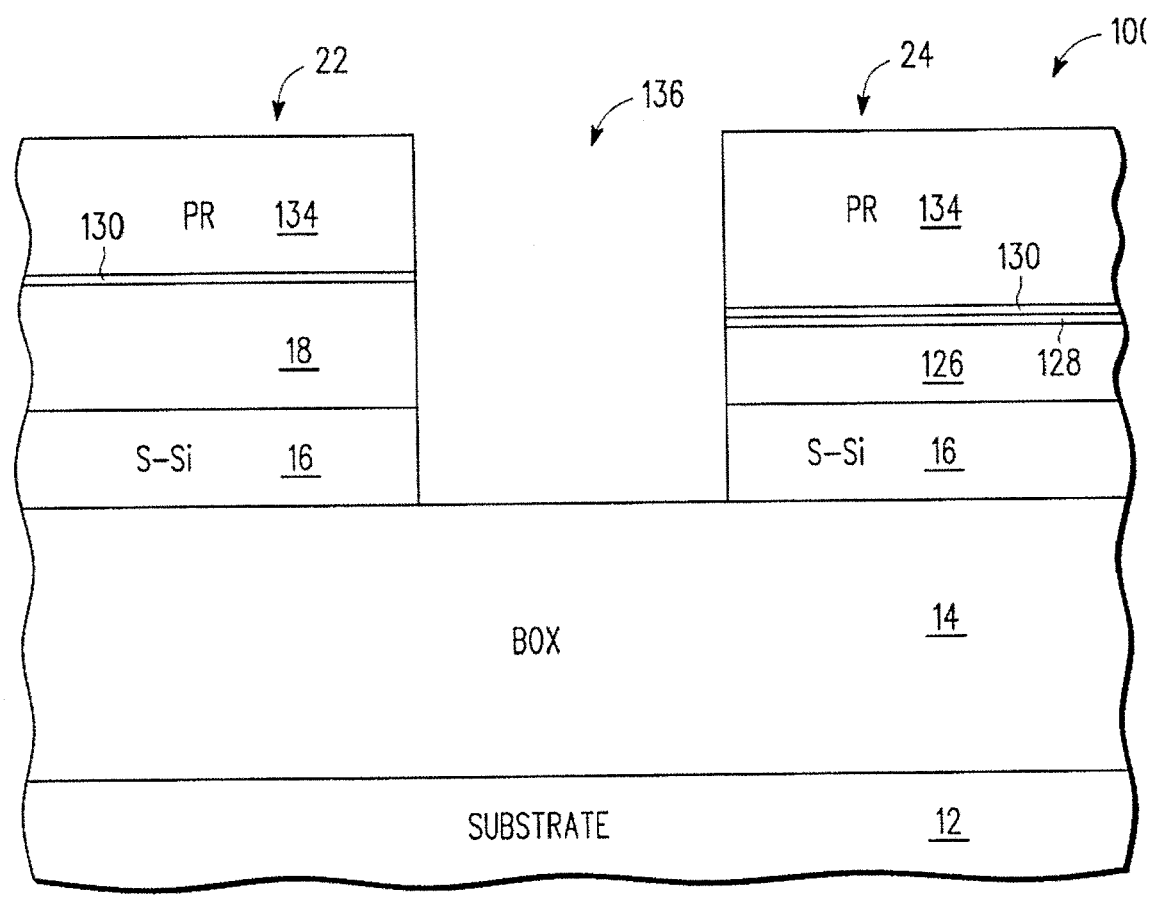

FIGS. 9-11 are cross-sectional views of a portion of a semiconductor structure 100 at various stages of a method for making the same, according to another embodiment of the present disclosure. The method is similar to that discussed herein with respect to FIGS. 1-8 with the following differences. In FIG. 9, the masking layer 18 has been patterned in a manner similar to that described with respect to FIG. 2. Subsequent to the patterning of masking layer 18, a second strained semiconductor layer 126 is selectively formed over the exposed portion of the first strained semiconductor layer 16 in the NMOS device region 24. In one embodiment, the second strained semiconductor layer 126 comprises selective deposition of SiC using a suitable process including the use of silane ($SiH_4$), methane ($CH_3$), and hydrogen chloride (HCl). In one embodiment, the second strained semiconductor layer 126 comprises a silicon carbon (SiC) layer having a thickness on the order of 100-150 Angstroms. In addition, the first strained semiconductor layer 16 can include a first lattice constant formed directly over the insulator layer 14 and the second strained semiconductor layer 126 can include a second lattice constant formed directly over the first semiconductor layer, wherein the second lattice constant is different from the first lattice constant.

In addition, the second strained semiconductor layer 126 formed over the strained semiconductor layer 16 in the NMOS device region 24 is single crystal or crystalline. In addition, the strained semiconductor layer 16 comprises a template strain layer configured for amplifying the intrinsic strain of the second strained semiconductor layer 126. A thin semiconductor cap layer 128 is formed over the second strained semiconductor layer 126, followed by the formation of a thin dielectric 130. In one embodiment, the thin semiconductor cap layer 128 comprises a silicon cap layer and the thin dielectric 130 comprises a thin oxide.

Turning now to FIG. 10, a patterned photoresist 134 is formed overlying portions of both the PMOS device region 22 and the NMOS device region 24. Patterned photoresist 134 includes an opening 136, wherein the opening is provided in preparation for isolation formation. An appropriate etch is then carried out to remove portions of the various layers that are exposed by opening 136, wherein the etch removes the corresponding layer material down to the insulator layer 14, as illustrated in FIG. 11. Subsequently, the patterned photoresist 134 is removed from the device structure 100, using any suitable technique(s).

As a result of etching the layer through opening 136, the PMOS device region 22 and NMOS device region 24 are effectively isolated from one another. Masking layer 18 and dielectric cap layer 130 are then selectively removed in the respective PMOS and NMOS device regions 22 and 24. The resulting exposed semiconductor surfaces in both the PMOS device region 22 and the NMOS device region 24 are then ready for subsequent transistor device processing, for example, as discussed herein above with respect to FIG. 8.

By now it should be appreciated that there has been provided a semiconductor device comprising a substrate; an oxide layer formed over the substrate; a first semiconductor layer having a first lattice constant formed directly over the oxide layer; and a second semiconductor layer having a second lattice constant formed directly over the first semiconductor layer, wherein the second lattice constant is different from the first lattice constant. In another embodiment, the semiconductor device further comprises a cap layer formed directly over the second semiconductor layer. The cap layer includes, for example, a silicon cap layer. The first semiconductor layer comprises, for example, strained silicon. The second semiconductor layer comprises, for example, silicon carbon.

In one embodiment, the semiconductor device further comprises an N-channel device including at least a portion of the first semiconductor layer and at least a portion of the second semiconductor layer. In another embodiment, the semiconductor device further comprises a P-channel device including at least a portion of the first semiconductor layer, but not comprising any portion of the second semiconductor layer.

In addition, the second semiconductor layer is formed using a material such as the second semiconductor layer amplifies strain created by the first semiconductor layer at least in a channel region of a device formed comprising at least the first semiconductor layer and the second semiconductor layer.

According to one embodiment, a semiconductor device comprises a substrate; an oxide layer formed over the substrate; a first semiconductor layer having a first lattice constant formed directly over the oxide layer; a second semiconductor layer having a second lattice constant formed directly over the first semiconductor layer, wherein the second lattice constant is different from the first lattice constant; an N-channel device comprising at least a portion of the first semiconductor layer and a portion of the second semiconductor layer; and a P-channel device comprising at least a portion of the first semiconductor layer, but not comprising any portion of the second semiconductor layer. In another embodiment, the semiconductor device further comprises a cap layer formed directly over the second semiconductor layer. The cap layer can include, for example, a silicon cap layer. In one embodiment, the first semiconductor layer comprises strained silicon. In another embodiment, the second semiconductor layer comprises silicon carbon.

In a further embodiment, the second semiconductor layer is formed using a material such that as the second semiconductor layer amplifies strain created by the first semiconductor layer at least in a portion of a channel region of the N-channel device.

According to another embodiment, a method for forming a semiconductor device includes forming a buried oxide layer over a substrate; forming a first semiconductor layer directly over the buried oxide layer, wherein the first semiconductor layer has a first lattice constant; forming an oxide layer over the first semiconductor layer; patterning a photoresist layer such that a P-channel device region is covered, but an N-channel device region is exposed; etching the oxide layer in the N-channel device region; removing the photoresist layer; and forming a second semiconductor layer directly interfacing with the first semiconductor layer in the N-channel device region, wherein the second semiconductor layer has a second lattice constant, and wherein the second lattice constant is different from the first lattice constant. In one embodiment, forming the second semiconductor layer comprises forming the second semiconductor layer in the N-channel device region only. In another embodiment, the method further comprises forming a cap layer directly over the second semiconductor layer. The cap layer can include, for example, a silicon cap layer. In one embodiment, the first semiconductor layer comprises strained silicon. In another embodiment, the second semiconductor layer comprises silicon carbon.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the embodiments of the present disclosure enable and are applicable to the enhancement of SSOI CMOS devices, including use for high-performance and low-power applications. In addition, the embodiments advantageously enable biaxial tension/strained NMOS devices to be obtained. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device, comprising: a substrate; an oxide layer formed over the substrate; a first semiconductor layer having a first lattice constant formed directly over the oxide layer; and a second semiconductor layer having a second lattice constant formed directly over the first semiconductor layer, wherein the second lattice constant is different from the first lattice constant; an N-channel device comprising at least a portion of the first semiconductor layer and at least a portion of the second semiconductor layer; a P-channel device comprising at least a portion of the first semiconductor layer, but not comprising any portion of the second semiconductor layer; wherein the second semiconductor layer is in direct contact with the first semiconductor layer.

2. The semiconductor device of claim 1 further comprising a cap layer formed directly over the second semiconductor layer.

3. The semiconductor device of claim 1, wherein the cap layer is a silicon cap layer.

4. The semiconductor device of claim 1, wherein the first semiconductor layer comprises strained silicon.

5. The semiconductor device of claim 1, wherein the second semiconductor layer comprises silicon carbon.

6. The semiconductor device of claim 1, wherein the second semiconductor layer is formed using the second semiconductor layer to amplify strain created by the first semiconductor layer at least in a channel region of a device formed comprising at least the first semiconductor layer and the second semiconductor layer.

7. A semiconductor device, comprising: a substrate; an oxide layer formed over the substrate; a first semiconductor layer having a first lattice constant formed directly over the oxide layer; a second semiconductor layer having a second lattice constant formed directly over the first semiconductor layer, wherein the second lattice constant is different from the first lattice constant; an N-channel device comprising at least a portion of the first semiconductor layer and a portion of the second semiconductor layer; and a P-channel device comprising at least a portion of the first semiconductor layer, but not comprising any portion of the second semiconductor layer; wherein the second semiconductor layer is in direct contact with the first semiconductor layer.

8. The semiconductor device of claim 7 further comprising a cap layer formed directly over the second semiconductor layer.

9. The semiconductor device of claim 8, wherein the cap layer is a silicon cap layer.

10. The semiconductor device of claim 7, wherein the first semiconductor layer comprises strained silicon.

11. The semiconductor device of claim 7, wherein the second semiconductor layer comprises silicon carbon.

12. The semiconductor device of claim 7, wherein the second semiconductor layer is formed using the second semiconductor layer to amplify strain created by the first semiconductor layer at least in a portion of a channel region of the N-channel device.

\* \* \* \* \*